United States Patent [19]

Aden et al.

[11] Patent Number: 5,467,061
[45] Date of Patent: * Nov. 14, 1995

[54] FLAT CABLE TO FLAT PARALLEL WIRE CABLE

[75] Inventors: Charles M. Aden; Martin H. Graham, both of Berkeley; Matthew Taylor, Pleasant Hill; Mark Miller, Oakland, all of Calif.

[73] Assignee: Tut Systems, Inc., Pleasanton, Calif.

[*] Notice: The portion of the term of this patent subsequent to Jan. 3, 2012, has been disclaimed.

[21] Appl. No.: 320,606

[22] Filed: Oct. 11, 1994

Related U.S. Application Data

[63] Continuation of Ser. No. 92,721, Jul. 16, 1993, Pat. No. 5,379,005.

[51] Int. Cl.[6] ............................................. H03H 5/00
[52] U.S. Cl. ........................... 333/24 R; 333/1; 333/25; 379/93; 375/257
[58] Field of Search ........................ 333/24 R, 1, 254, 333/124, 4, 5; 174/117 F; 379/93; 375/36

[56] References Cited

U.S. PATENT DOCUMENTS

| | | | |
|---|---|---|---|
| 3,697,896 | 10/1972 | Sarkozi et al. | 333/24 R |
| 3,703,604 | 11/1972 | Henschen et al. | 333/33 |
| 3,882,432 | 5/1975 | Bowman et al. | 333/32 |
| 4,717,896 | 1/1988 | Graham . | |
| 4,754,102 | 6/1988 | Dzurak | 333/1 |
| 4,800,344 | 1/1989 | Graham . | |
| 5,003,579 | 3/1991 | Jones | 379/93 |
| 5,191,300 | 3/1993 | Graham . | |
| 5,309,123 | 5/1994 | Gelin | 333/124 |
| 5,321,372 | 6/1994 | Smith | 333/1 |
| 5,379,005 | 7/1993 | Aden et al. | 333/24 R |

*Primary Examiner*—Robert J. Pascal
*Assistant Examiner*—Darius Gambino
*Attorney, Agent, or Firm*—Blakely, Sokoloff, Taylor & Zafman

[57] ABSTRACT

A LAN which uses flat telephone cable having at least four conductors. The inner conductors are joined together and the outer conductors are joined together at each node thereby making reversals of the inner and outer conductors, which may occur at connectors, impossible. Each node uses two baluns to provide an unbalanced zone between the baluns for connecting to the DTE.

7 Claims, 3 Drawing Sheets

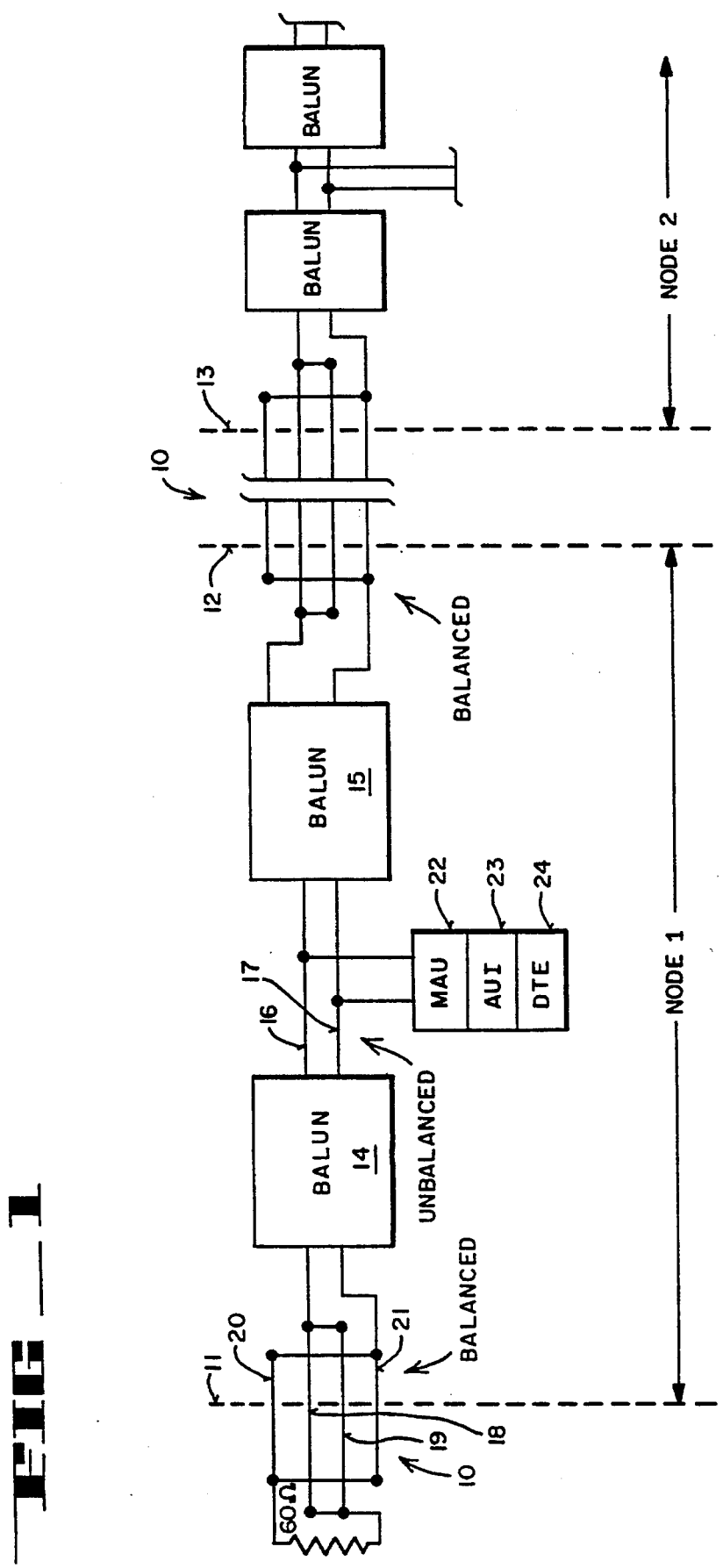

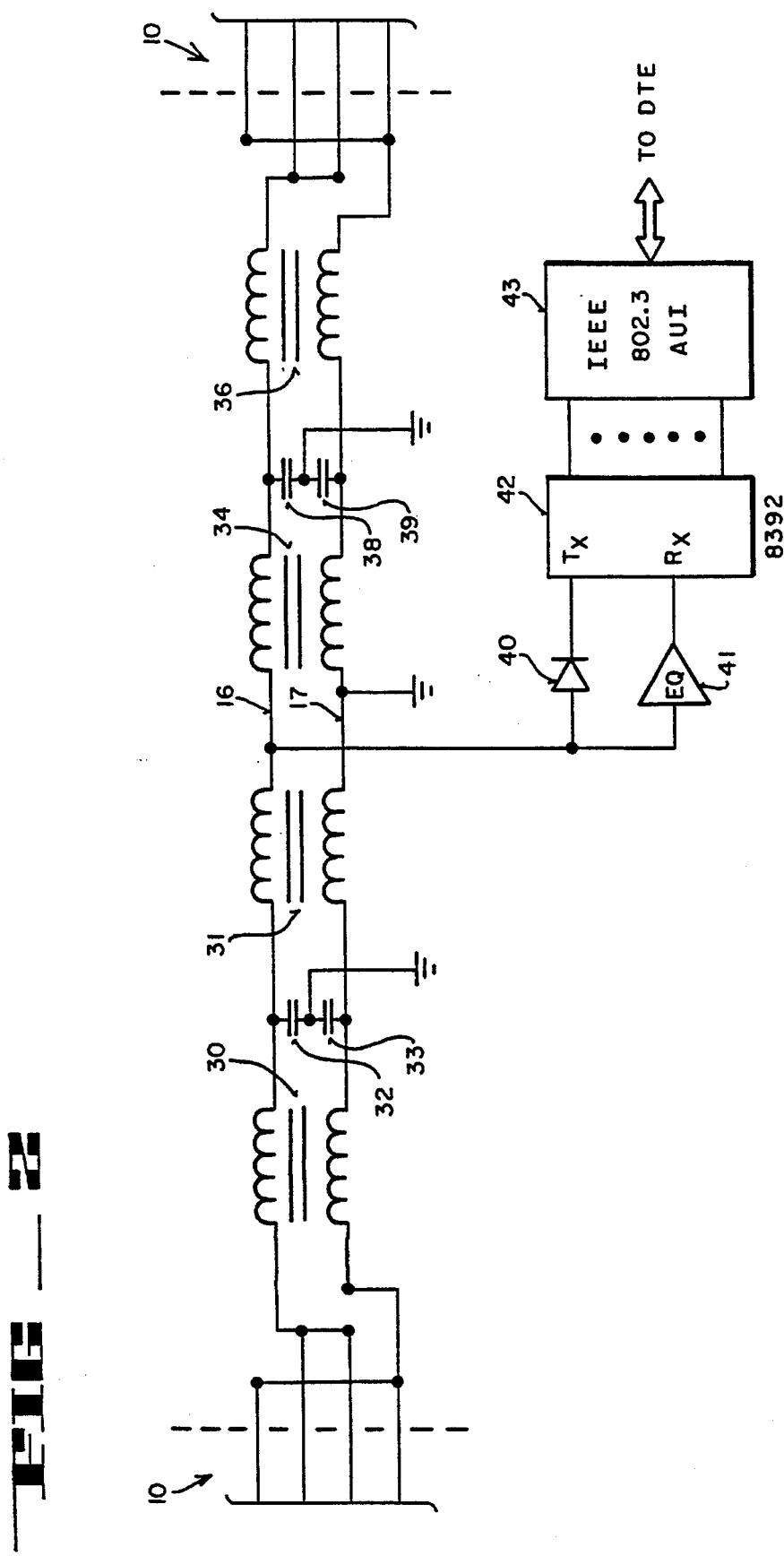
FIG—2

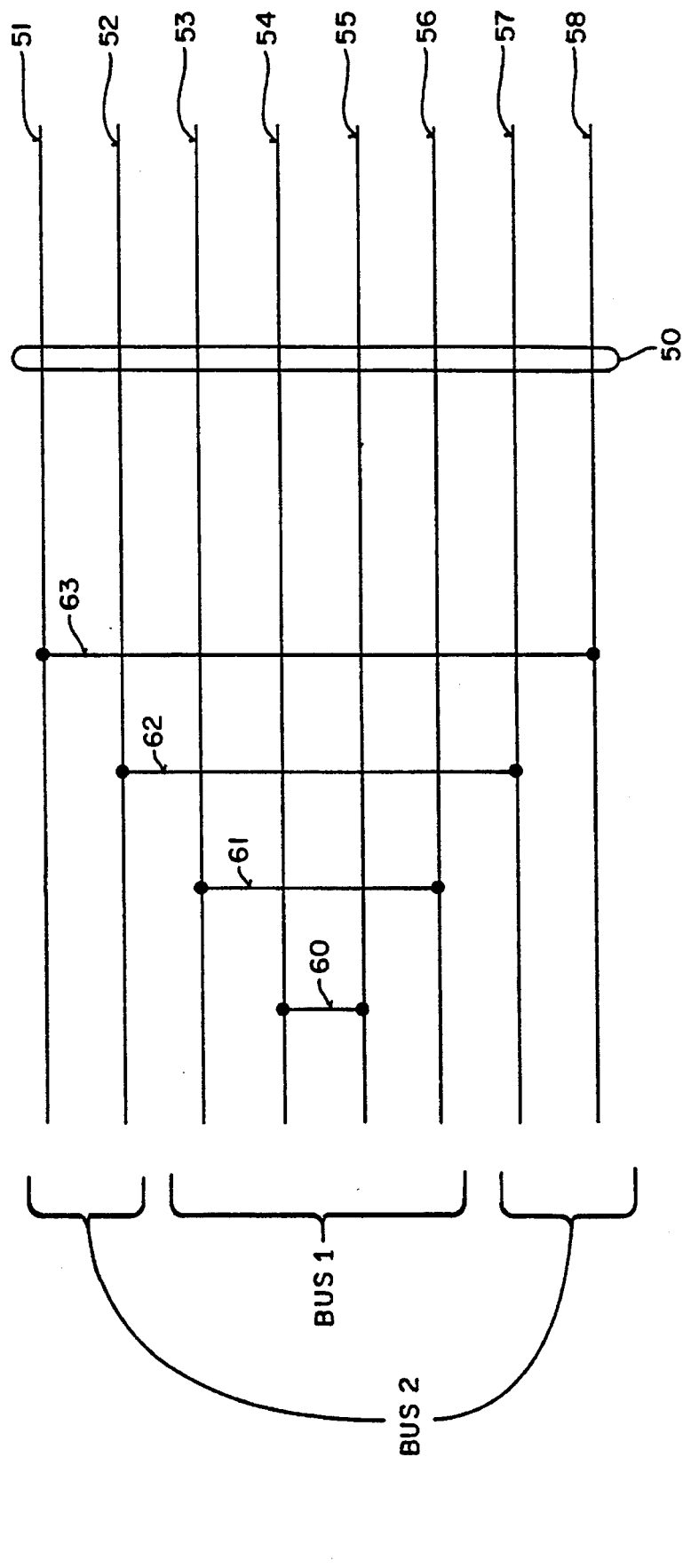

FLAT CABLE TO FLAT PARALLEL WIRE CABLE

This is a continuation of application Ser. No. 08/092,721, filed Jul. 16, 1993 now U.S. Pat. No. 5,379,005.

BACKGROUND OF THE INVENTION

1. Field of the Invention

The invention relates to local area networks (LANs) and more particularly, to medium access where a flat parallel wire telephone cable is used for the medium.

2. Prior Art

Local area networks (LANs) have become widely used, particularly to interconnect personal computers, servers, peripherals, etc. Among the most popular LANs is Ethernet which often uses a 50 ohm coaxial cable or uses an unshielded twisted pair line having 100 ohm characteristic impedance.

In these networks with unshielded cables, it is often desirable that the current in the medium be balanced, that is, that the network operate in a differential mode since this prevents troublesome radiation and limits susceptibility to external electronic noise. There are numerous well-known circuits, filters, terminators, etc. for preventing radiation from and limiting the susceptibility of these networks.

As will be seen, the present invention preferably uses a flat parallel wire telephone cable which has at least four conductors. Moreover, the invention makes use of baluns, such as the baluns disclosed in U.S. Pat. No. 4,717,896.

SUMMARY OF THE INVENTION

An improved method for coupling a node into a network where the network uses a generally balanced line is described. The method makes use of a first balun and a second balun connected in sedes and connected into the transmission line so that the current in the line passes through the baluns. The pair of leads between the baluns forms a zone in which the line can be unbalanced without causing increased radiation or increasing the susceptibility to external noise, common mode currents can be better tolerated. Consequently, components of the medium access unit which may operate in an unbalanced mode can be connected directly to the leads.

In the preferred embodiment of the present invention, the line comprises a four conductor flat parallel wire telephone cable having two inner conductors and two outer conductors. At each of the nodes the two inner conductors are electrically connected together and the two outer conductors are electrically connected together. This provides a medium having a characteristic impedance of approximately 60 ohms. There are several advantages to this, among them is that there is no reversal of the signal polarity from node-to-node even where connectors are used that reverse the two inner conductors and reverse the two outer conductors.

BRIEF DESCRIPTION OF THE DRAWINGS

FIG. 1 shows a portion of a network fabricated in accordance with the present invention.

FIG. 2 is an electrical schematic of one node of a network fabricated in accordance with the present invention.

FIG. 3 illustrates a cable having two inner conductors and three outer pairs of conductors connected in accordance with the present invention to provide two buses.

DETAILED DESCRIPTION OF THE PRESENT INVENTION

An improved LAN which employs a flat parallel wire telephone cable and is particularly suited for Ethernet protocol is described. In the following description numerous specific details are set forth, such as part numbers, in order to provide a thorough understanding of the present invention. It will be obvious to one skilled in the art that the present invention may be practiced without these specific details. In other instances well-known components and parts are not described in detail in order not to unnecessarily obscure the present invention.

Referring first to FIG. 1 a portion of a LAN is illustrated which has a medium (cable) 10 supporting a node 1 defined between the dotted lines 11 and 12 and supporting a second node, node 2, partially shown to the right of the dotted line 13.

In the currently preferred embodiment, the medium 10 is a flat parallel wire telephone cable sometimes referred to as "silver-satin" that has at least four conductors; specifically, two inner conductors 18 and 19 (typically color coded red and green) and two outer conductors 20 and 21 (typically color coded yellow and black). The cable 10 in some cases may include additional outer pairs since such cabling often contains six or eight conductors.

In the presently preferred embodiment, to connect a node into the cable 10, the cable is cut or otherwise opened, the outer conductors 20 and 21 are electrically connected together and the inner conductors 18 and 19 are also connected together. This forms two leads at each end of the cut. Two of these leads are connected to a balun 14 and the other two to a balun 15. The baluns 14 and 15 are connected in sedes as shown by the leads 16 and 17. Thus, the baluns 14 and 15 are connected in sedes with the cable 10 as illustrated.

Typically the cable 10 has a characteristic impedance of approximately 100 ohms for adjacent pairs of conductors. With the conductors of cable 10 connected as shown in FIG. 1, the characteristic impedance of the cable is reduced to approximately 60 ohms. This provides several advantages which will be discussed later.

The remainder of the medium access unit (MAU 22) is connected to the leads 16 and 17. MAU 22, as is customadly done in Ethernet LANs, is connected to an attachment unit interface (AUI 23). This interface is connected to a computer, repeater or the like, sometimes generically referred to as data terminal equipment (DTE 24).

In LANs using unshielded cables, it is desirable to maintain only balanced conditions (differential mode current) in the medium to prevent electromagnetic interference both to and from the LAN. This goal is made more difficult because transceivers often introduce common mode currents into the medium. With the present invention, the baluns 14 and 15 form a zone between them where the unbalanced currents can be better tolerated since their effect on the medium is attenuated by the baluns.

The ends of the medium are terminated in 60 ohm resistors, the characteristic impedance of the cable. The two outer conductors are connected to one terminal of a resistor and the two inner conductors are connected to the other terminal of the resistor as shown in FIG. 1.

Referring now to FIG. 2, a node in accordance with the present invention is shown in more detail. The opening of a cable 10, formed to allow for the node, is again shown connected in sedes with two baluns. One balun comprising the bifilar chokes 30 and 31 with capacitors 32 and 33 connected between the chokes. The other balun includes the bifilar chokes 34 and 36 with capacitors 38 and 39 connected between them.

The leads 16 and 17 are again shown in FIG. 2 with the lead 17 connected to ground. The lead 16 is connected through the diode 40 to the transmit terminal of a transceiver 42. The diode 40 is typically used on the transmission terminal of transceivers: such as transceiver 42, to provide isolation to the driver transistors within the transceiver. Lead 16 also provides the received signal which is coupled to the receive signal terminal of the transceiver 42 through an equalizer 41.

In the currently preferred embodiment the transceiver comprises an integrated circuit, part number 8392, manufactured by National Semiconductor as well as other companies. (Other commercially available transceivers may be used). The output of the transceiver 42 is connected to the DTE through an attachment unit interface (AUI 43). In the currently preferred embodiment the AUI complies with IEEE Standard 802.3, 10 Base5 AUI part.

The equalizer 41 is only required where the cable 10 is very long. There is an equalizer within transceiver 42 which is adequate for many LANs. The optional equalizer 41 can be built as described in U.S. Pat. No. 5,191,300. It should provide broad band performance, for example, from DC to 15 MHz.

In the currently preferred embodiment, the baluns have low transmission loss for differential signals; this is helpful since there are two baluns for each node. Also they should have a differential impedance (e.g., 60 ohms) that matches the transmission line impedance in order to prevent mismatches between the cables and the nodes.

Referring again to the cable 10 shown in FIGS. 1 and 2, connecting the inner conductors together and the outer conductors together provides several important advantages:

A key problem in some LANs is detecting the polarity of the data. For example, where an ordinary flat telephone wire transmission line (two conductors) is used, these conductors may be reversed (red to green and green to red) at various points in the network; this is caused by some modular telephone cables that reverse the conductors. These reversals add to the problem of deciding on polarity. If multiple cables are used and some or all have reversals, the polarity of the data will vary along the length of the LAN making it difficult for individual nodes to properly interpret its sense. These reversals also cause problems when simultaneous transmissions occur since the transmissions can cancel each other, making detection of simultaneous transmissions (collisions) more difficult.

With the inner and outer conductors connected as shown in FIGS. 1 and 2 the problem of polarity reversal is eliminated. Such reversals become transparent since the inner conductors are effectively one conductor and the outer conductors are the other conductor of the medium. Even if modular telephone connectors are used that reverse the red and green leads and the yellow and black leads, polarity is not reversed.

As mentioned, with the connections shown in FIG. 1 and 2, the characteristic impedance is reduced from approximately 100 ohms to 60 ohms. Typically, 50 ohm coaxial cable is used in Ethernet applications. The difference between 50 ohms and 60 ohms is small enough to permit some circuits, particularly integrated circuits, designed for Ethernet coaxial cable to be more effectively used with the flat telephone cable as connected above. Moreover, with a 60 ohm impedance versus a 100 ohm impedance, loading of the medium by the nodes becomes less of a problem since it is easier to achieve a high ratio of load-to-cable impedance.

The cable connection discussed above may also be used for two buses as shown in FIG. 3. A flat parallel wire telephone cable 50 having two inner conductors and three outer pairs is used. The inner conductors (54, 55) are connected together (e.g., connector 60) and the pair of outer conductors (53, 56) adjacent to the inner conductors (54, 55) are also connected together (e.g., connector 61) to form one bus (BUS 1). The next outer pair of conductors (52, 57) are connected (e.g., connector 62) and the outer most pair of conductors (51, 18) are connected (e.g., connector 63) thereby forming a second bus (BUS 2).

An improved LAN has been described, particularly suitable for Ethernet applications where zones of unbalanced currents can be tolerated and where the commonly used telephone cables having at least four conductors are put to advantage.

We claim:

1. A method of communicating an Ethernet message on a flat cable, said flat cable having at least four insulated conductors, said method comprising the steps of:

connecting at both ends a first pair of said four insulated conductors to form a first half of a transmission line;

connecting at both ends a second pair of said four insulated conductors to form a second half of said transmission line;

connecting a first terminal of an Ethernet message transmitting circuit to said first half of said transmission line;

connecting a second terminal of said Ethernet message transmitting circuit to said second half of said transmission line;

transmitting said Ethernet message on said transmission line.

2. The method of claim 1 wherein an impedance of a transmission line consisting of two of said insulated conductors is approximately one hundred ohms, and said step of connecting at both ends said first pair of said four insulated conductors includes:

connecting at both ends said first pair of said four insulated conductors to form a first half of a transmission line having an impedance of approximately sixty ohms.

3. The method of claim 1 wherein said step of connecting said first terminal of said Ethernet message transmitting circuit includes:

connecting said first terminal of a balun to said first half of said transmission line.

4. The method of claim 1 wherein said step of connecting said first terminal of said Ethernet message transmitting circuit includes:

connecting a first terminal of an Ethernet message transmitting circuit having impedance matching for an impedance of approximately sixty ohms to said first half of said transmission line.

5. A method of creating an Ethernet transmission line from a flat cable, said flat cable having at least four insulated conductors, wherein a pair of said four insulated conductors forming a first transmission line has an impedance of approximately one hundred ohms, said method comprising the steps of:

connecting at both ends a first pair of said four insulated conductors to form a first half of said Ethernet transmission line;

connecting at both ends a second pair of said four insulated conductors to form a second half of said Ethernet transmission line;

terminating one end of said Ethernet transmission line with a first load having an impedance of approximately sixty ohms;

terminating the other end of said Ethernet transmission line with a second load having an impedance of approximately sixty ohms; and creating a first Ethernet port to said Ethernet transmission line by providing a connection to said first half of said Ethernet transmission line and said second half of said Ethernet transmission line.

6. An Ethernet network using a flat cable, the impedance between any pair of conductors of said flat cable being approximately one hundred ohms, said Ethernet network comprising:

a flat cable having at least four insulated conductors, both ends of a first pair of said four insulated conductors being connected to form one half of a transmission line, both ends of a second pair of said four insulated conductors being connected to form a second half of said transmission line, the impedance of said transmission line being approximately sixty ohms; and an Ethernet device connected to said transmission line.

7. The Ethernet network of claim 6 wherein said both ends of said transmission line are terminated with a load having an impedance of approximately sixty ohms.

* * * * *

UNITED STATES PATENT AND TRADEMARK OFFICE
CERTIFICATE OF CORRECTION

PATENT NO.   : 5,467,061
DATED        : November 14, 1995
INVENTOR(S)  : Aden et al.

It is certified that error appears in the above-identified patent and that said Letters Patent is hereby corrected as shown below:

In column 1 at line 37 delete "sedes" and insert --series--

In column 2 at line 34 delete "sedes" and insert --series--

In column 2 at line 35 delete "sedes" and insert --series--

In column 2 at line 44 delete "customadly" and insert --customarily--

In column 2 at line 67 delete "sedes" and insert --series--

Signed and Sealed this

Ninth Day of September, 1997

*Attest:*

BRUCE LEHMAN

*Attesting Officer*  Commissioner of Patents and Trademarks